(12) United States Patent
Hoshino et al.

(10) Patent No.: US 7,828,891 B2
(45) Date of Patent: Nov. 9, 2010

(54) PIGMENT COMPOSITIONS, COLORED COMPOSITIONS MAKING USE OF THE PIGMENT COMPOSITIONS, AND COLOR FILTERS

(75) Inventors: Ryo Hoshino, Chuo-ku (JP); Hideki Ito, Chuo-ku (JP); Kazuhiko Kaneko, Chuo-ku (JP); Kazutaka Aoki, Chuo-ku (JP); Shotoku Takami, Chuo-ku (JP)

(73) Assignee: Dainichiseika Color & Chemicals Mfg. Co., Ltd., Tokyo (JP)

( * ) Notice: Subject to any disclaimer, the term of this patent is extended or adjusted under 35 U.S.C. 154(b) by 0 days.

(21) Appl. No.: 12/592,009

(22) Filed: Nov. 18, 2009

(65) Prior Publication Data

US 2010/0065794 A1    Mar. 18, 2010

Related U.S. Application Data

(62) Division of application No. 11/875,154, filed on Oct. 19, 2007, now Pat. No. 7,655,087.

(30) Foreign Application Priority Data

| | | | |
|---|---|---|---|
| Nov. 2, 2006 | (JP) | ............... | 2006-298905 |
| Nov. 2, 2006 | (JP) | ............... | 2006-298906 |
| Jan. 15, 2007 | (JP) | ............... | 2007-005763 |
| Jan. 26, 2007 | (JP) | ............... | 2007-016863 |

(51) Int. Cl.
*C09B 67/20*    (2006.01)

(52) U.S. Cl. ............... 106/493; 106/31.77; 106/31.78; 106/31.8; 106/413; 106/494; 106/495; 106/496; 106/497; 106/498; 106/499; 430/7

(58) Field of Classification Search ............... 106/31.77, 106/31.78, 31.8, 493, 413, 494, 495, 496, 106/497, 498, 499; 430/7
See application file for complete search history.

(56) References Cited

U.S. PATENT DOCUMENTS

| | | | |
|---|---|---|---|
| 4,999,132 A | 3/1991 | Canestri | |
| 6,648,954 B2 | 11/2003 | Uemura et al. | |
| 7,347,894 B2 | 3/2008 | Yanagimoto et al. | |
| 7,434,899 B2 * | 10/2008 | Nakajima | ............... 347/6 |

FOREIGN PATENT DOCUMENTS

| | | |
|---|---|---|
| EP | 0 535 774 A2 | 4/1993 |
| EP | 1 146 094 A2 | 10/2001 |
| EP | 1 715 007 A2 | 10/2006 |
| EP | 1 762 597 A1 | 3/2007 |
| JP | 59-227951 A | 12/1984 |
| JP | 1-144475 A | 6/1989 |
| JP | 1-306475 A | 12/1989 |
| JP | 8-020731 A | 1/1996 |
| JP | 8-027391 A | 1/1996 |
| JP | 9-122470 A | 5/1997 |
| JP | 9-137075 A | 5/1997 |
| JP | 2001-172520 A | 6/2001 |
| JP | 2003-066224 A | 3/2003 |
| WO | WO2004/067643 A1 * | 8/2004 |

OTHER PUBLICATIONS

Hays, B., Surface Treatment of Organic Pigments for Printing Ink Applications, American Ink Maker, vol. 62, Jun. 1984, pp. 28-50.
European Patent Office, Extended European Search Report for European Patent Application No. EP 07 02 0441, Jun. 2, 2009, European Patent Office, Munich, Germany.

* cited by examiner

*Primary Examiner*—Anthony J Green
(74) *Attorney, Agent, or Firm*—Chapman and Cutler LLP

(57) ABSTRACT

Pigment compositions each contain an organic pigment and at least one compound selected from compounds represented by the following formula (II), respectively:

$$A\text{-}N{=}N\text{-}CH(COCH_3)\text{-}CONH\text{-}E,$$

$$B\text{-}N{=}N\text{-}CH(COCH_3)\text{-}CONH\text{-}E \text{ or}$$

$$C\text{-}N{=}N\text{-}CH(COCH_3)\text{-}CONH\text{-}E,$$

wherein A represents a substituted or unsubstituted phenyl group, B represents a substituted or unsubstituted β-naphthyl group, C represents a substituted or unsubstituted α-anthraquinonyl group, D represents a particular substituted aromatic group, and E represents a substituted or unsubstituted phenyl group, with a proviso that the compounds each have at least one substituent represented by —COOM or —SO$_3$M in which M represents a hydrogen atom, metal atom, ammonium group, organic amine group or quaternary ammonium group. Colored compositions making use of the pigment compositions and color filters making use of the colored compositions are also disclosed.

9 Claims, No Drawings

PIGMENT COMPOSITIONS, COLORED COMPOSITIONS MAKING USE OF THE PIGMENT COMPOSITIONS, AND COLOR FILTERS

CROSS-REFERENCE TO RELATED APPLICATION

This application is a divisional of prior application Ser. No. 11/875,154, filed Oct. 19, 2007, issued as U.S. Pat. No. 7,655,087 on Feb. 2, 2010, claims the priorities of Japanese Patent Applications 2006-298905 filed Nov. 2, 2006, 2006-298906 filed Nov. 2, 2006, 2007-005763 filed Jan. 15, 2007, and 2007-016863 filed Jan. 26, 2007, all of which are incorporated herein by reference.

FIELD OF THE INVENTION

This invention relates to pigment compositions, colored compositions and color filters.

BACKGROUND OF THE INVENTION

There are numerous known examples that use pigments as colorants for high molecular organic compounds, including various printing inks such as gravure printing inks, sizing colors, binder colors, coating materials, various coating formulations, dry toners and wet toners for electrophotography, thermal transfer recording inks, inks for writing instruments, and the like (for example, JP-A-08-020731 and JP-A-08-027391).

No pigment colorants are, however, known to be fully equipped with properties such as high transparency and vividness required for coating formulations for the formation of color filter pixels and inkjet inks. Fine division of a pigment for use in these applications to a primary particle size level of from several tens to several hundreds nanometers in an attempt to improve its transparency and vividness, however, leads to an increase in the recoagulation power of pigment particles themselves so that the pigment is deteriorated in dispersibility and dispersion stability. Technologies making use of dispersants or the like are hence known (for example, JP-A-09-122470, JP-A-09-137075 and JP-A-2003-066224). These technologies are, however, still insufficient to obtain the properties required for the above-described applications. It is, therefore, the current circumstances that with pigment colorants prepared by the above-mentioned conventional technologies, the requirement for such high dispersibility, dispersion stability, transparency, vividness and the like cannot be fully satisfied in their entirety.

SUMMARY OF THE INVENTION

Objects of the present invention are, therefore, to provide a pigment composition excellent in dispersibility, dispersion stability, transparency, vividness and the like, a colored composition containing the pigment composition, and a color filter making use of the colored composition.

The above-described objects can be achieved by the present invention to be described hereinafter. In first aspect of the present invention, there is thus provided a pigment composition comprising an organic pigment and at least one compound selected from compounds represented by the following formulas (I-1), (I-2) and (I-3), respectively:

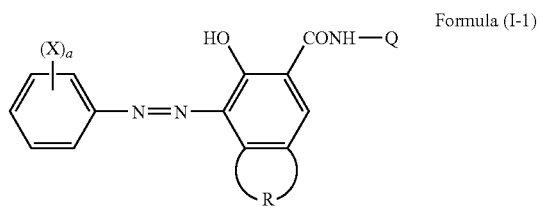

Formula (I-1)

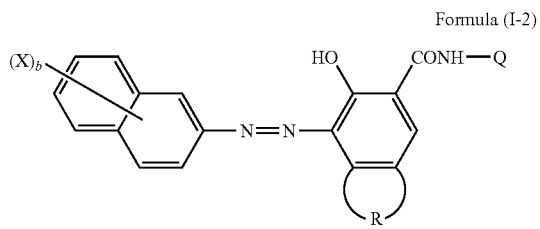

Formula (I-2)

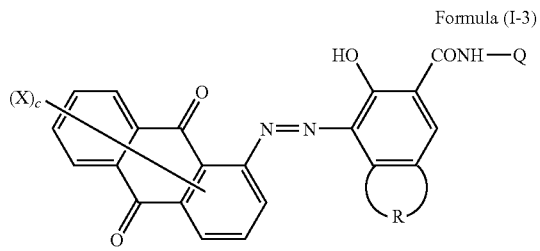

Formula (I-3)

wherein a stands for an integer of from 0 to 5, b and C each independently stand for an integer of from 0 to 7, X represents a substituent when a, b and c are 1, Xs each independently represent a substituent when a, b and c are an integer of 2 or greater, Q represents a hydrogen atom or a substituted or unsubstituted phenyl group, and R represents a hydrogen atom or a substituted or unsubstituted aromatic ring, with a proviso that the compounds represented by the formulas (I-1), (I-2) and (I-3), respectively, each have at least one substituent represented by COOM or $SO_3M$ in which M represents a hydrogen atom, metal atom, ammonium group, organic amine group or quaternary ammonium group.

In the formula (I-1), a may preferably stand for an integer of 0, 1, 2 or 3; in the formula (I-2), b may preferably stand for an integer of 1; in the formula (I-3), c may preferably stand for an integer of 0 or 2; and in the formulas (I-1), (I-2) and (I-3), X may preferably represent Cl, Br, $CH_3$, $OCH_3$, $SO_3H$, $NO_2$ or $CONH_2$, Q may preferably represent a phenyl, o-methylphenyl, p-sulfophenyl or p-chlorophenyl group, and R may preferably represent a benzene ring; with a proviso that the compounds represented by the formulas (I-1), (I-2) and (I-3), respectively, each may preferably have at least one substituent represented by $SO_3M$ in which M represents a hydrogen atom, metal atom, ammonium group, organic amine group or quaternary ammonium group.

The organic pigment may preferably be at least one pigment selected from C.I. Pigment Red 122, C.I. Pigment Red 177, C.I. Pigment Red 254, and C.I. Pigment Violet 19.

In a second aspect of the present invention, there is also provided a pigment composition comprising an organic pigment and at least one compound selected from compounds represented by the following formulas (II-1), (II-2) and (II-3), respectively:

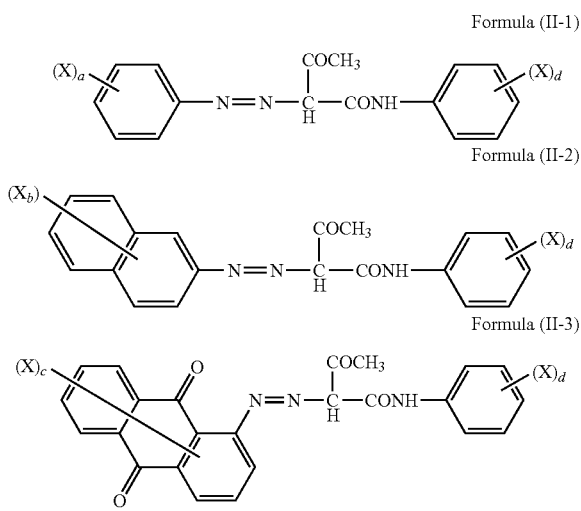

Formula (II-1)

Formula (II-2)

Formula (II-3)

wherein a and d each independently stand for an integer of from 0 to 5, b and c each independently stand for an integer of from 0 to 7, X represents a substituent when a, b, c and d are 1, Xs each independently represent a substituent when a, b, c and d are an integer of 2 or greater, with a proviso that the compounds represented by the formulas (II-1), (II-2) and (II-3), respectively, each have at least one substituent represented by COOM or $SO_3M$ in which M represents a hydrogen atom, metal atom, ammonium group, organic amine group or quaternary ammonium group.

In the formula (II-1), a may preferably stand for an integer of 0, 1, 2 or 3; in the formula (II-2), b may preferably stand for an integer of 1; in the formula (II-3), c may preferably stand for an integer of 0 or 2; and in the formulas (II-1), (II-2) and (II-3), d may preferably stand for an integer of 0, 1 or 2, X may preferably represent $CH_3$, $OCH_3$, or $SO_2NH_2$; with a proviso that the compounds represented by the formulas (II-1), (II-2) and (II-3), respectively, each may preferably have at least one substituent represented by $SO_3M$ in which M represents a hydrogen atom, metal atom, ammonium group, organic amine group or quaternary ammonium group.

The organic pigment may preferably be at least one pigment selected from C.I. Pigment Yellow 138, C.I. Pigment Yellow 150, C.I. Pigment Green 7, C.I. Pigment Green 36, C.I. Pigment Red 122, and C.I. Pigment Violet 19.

In each of the above-described pigment compositions according to the present invention, the organic pigment may preferably have a primary particle size of not greater than 100 nm; and the at least one compound selected from the compounds represented by the respective formulas (I-1), (I-2) and (I-3) or the at least one compound selected from the compounds represented by the respective formulas (II-1), (II-2) and (II-3) (which may hereinafter be called "the acid-group-containing compound according to the present invention") may preferably be contained in a mixing proportion of from 0.1 to 30 parts by weight per 100 parts by weight of the organic pigment.

In a third aspect of the present invention, there is also provided a colored composition comprising one of the pigment compositions according to the first and second aspects of the present invention and a film-forming material. In a fourth aspect of the present invention, there is also provided an inkjet ink comprising the colored composition and a liquid medium. In a fifth aspect of the present invention, there is also provided a coating formulation for the formation of color filter pigments, which comprises the colored composition and a liquid medium. In a sixth aspect of the present invention, there is also provided a color filter comprising pixels formed with the coating formulation.

The present invention can provide pigment compositions excellent in dispersibility, dispersion stability and vividness and also colored compositions making use of these pigment compositions. These pigment compositions and colored compositions according to the present invention can be used, for example, in various printing inks, sizing colors, binder colors, coating materials, various coating formulations, dry toners and wet toners for electrophotography, thermal transfer recording inks, inks for writing instruments, coating formulations for the formation of color filter pixels, inkjet inks, and the like. Among these, they are useful especially for coating formulations for the format ion of color filter pixels and inkjet inks, which require high levels of dispersibility, dispersion stability, transparency and vividness.

DETAILED DESCRIPTION OF THE INVENTION AND PREFERRED EMBODIMENTS

The present invention will next be described in further detail on the basis of certain preferred embodiments.

[First and Third to Sixth Aspects of the Present Invention]

The acid-group-containing compound for use in the first aspect of the present invention can be obtained by a conventionally-known coupling reaction from a diazonium salt of a compound represented by the following formula (I-4), (I-5) or (I-6), as a diazo component, and a compound represented by the following formula (I-7), as a coupler component, and no particular limitation is imposed on its production process. It is, however, to be noted that upon the above-described coupling reaction, the compound represented by the formula (I-4), (I-5) or (I-6) and the compound represented by the formula (I-7) need to be selected such that the resulting compound represented by the formula (I-1), (I-2) or (I-3) contains at least one group COOM or $SO_3M$ in which M has the same meaning as defined above.

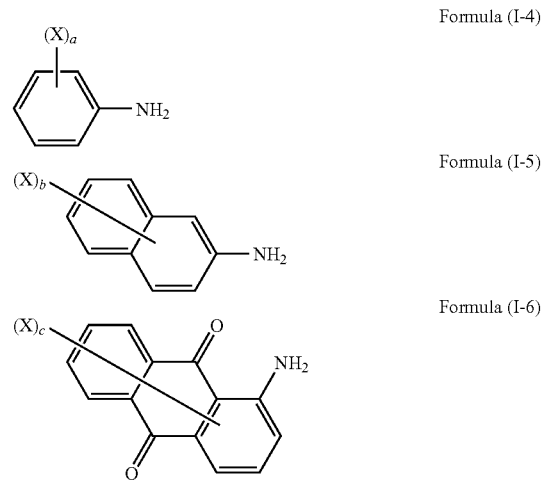

Formula (I-4)

Formula (I-5)

Formula (I-6)

wherein a, b, c and X has the same meanings as defined above.

Examples of the compounds represented by the formulas (I-4) to (I-6), respectively, include, but are not limited to, 2-amino-4-methyl-5-chlorobenzenesulfonic acid, 3-amino- 6-chlorobenzenesulfonic acid, 3-amino-4-methoxybenzamide, 2-amino-4-nitrotoluene, 2-aminonaphthalenesulfonic acid, 1-amino-4-bromoanthraquinone-2-sulfonic acid, α-aminoanthraquinone, aniline, 4-amino-3-nitrotoluene, 4-amino-3-methoxynitrobenzene, 4-aminobenzenesulfonic acid, and 3-amino-4-methoxybenzanilide.

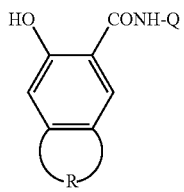

Formula (I-7)

wherein Q and R have the same meanings as defined above.

Examples of the compound represented by the formula (I-7) include, but are not limited to, 2-hydroxy-3-phenylcarbamoylnaphthalene, 2-hydroxy-3-(2-methylphenylcarbamoyl)naphthalene, 2-hydroxy-3-(4-chlorphenylcarbamoyl)naphthalene, and 2-hydroxy-3-naphtoic acid anilide-4'-sulfonic acid.

In the formulas (I-1) to (I-7), examples of the substituent or substituents other than COOH and/or $SO_3H$ include, but are not limited to, nitro, hydroxy, alkoxy, alkyl, and halogen. Examples of the metal that can form a salt with COOH or $SO_3H$ include, but are not limited to, alkali metals such as Li, Na and K and multivalent metals such as Ca, Ba, Al, Mn, Sr, Mg and Ni. Examples of the organic amine that can form a salt with COOH or $SO_3H$ include, but are not limited to, (mono, di or tri)alkylamines and substituted or unsubstituted alkylamines. Examples of the aromatic ring include a benzene ring and a naphthalene ring. As the one or more acid groups in each acid-group-containing compound, sulfonic groups or salts thereof are particularly preferred. Preferably, each acid-group-containing compound contains one sulfonic group per molecule.

Illustrative organic pigment usable in the first aspect of the present invention include, but are not limited to, azo pigments, phthalocyanine pigments, quinacridone pigments, perylene/perinone pigments, isoindolinone pigments, isoindoline pigments, dioxazine pigments, quinophthalone pigments, diketopyrrolopyrole pigments, anthraquinone pigments, thioindigo pigments, and metal complex pigments.

Among these organic pigments, particularly preferred is at least one organic pigment selected from C.I. Pigment Red 122, C.I. Pigment Red 177, C.I. Pigment Red 254 and C.I. Pigment Violet 19.

[Second to Sixth Aspects of the Present Invention]

The acid-group-containing compound for use in the second aspect of the present invention can be obtained by a conventionally-known coupling reaction from a diazonium salt of a compound represented by the formula (I-4), (I-5) or (I-6), as a diazo component, and a compound represented by the following formula (II-7), as a coupler component, and no particular limitation is imposed on its production process. It is, however, to be noted that upon the above-described coupling reaction, the compound represented by the formula (I-4), (I-5) or (I-6) and the compound represented by the formula (II-7) need to be selected such that the resulting compound represented by the formula (II-1), (II-2) or (II-3) contains at least one group COOM or $SO_3M$ in which M has the same meaning as defined above.

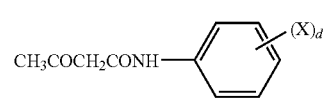

Formula (II-7)

wherein d and X has the same meanings as defined above.

Examples of the compound represented by the formula (II-7) include, but are not limited to, acetoacetic acid anilide, acetoacetic acid-o-toluidide, acetoacetic acid-o-anisidide, acetoaceto-4-sulfanilic acid, and acetoaceto-2-methyl-4-sulfanilic acid.

In the formulas (II-7), examples of the substituent or substituents other than COOH and/or $SO_3H$ include, but are not limited to, —$NO_2$, —OH, —CONHR, —$SO_2$NHR, —$SO_2$NR, —$SO_2CH_2$R, alkoxy groups such as —$OCH_3$, alkyl groups such as —$CH_3$, and halogen atoms. R represents a substituted or unsubstituted phenyl or alkyl group. Examples of the metal that can form a salt with COOH or $SO_3H$ include, but are not limited to, alkali metals such as Li, Na and K and multivalent metals such as Ca, Ba, Al, Mn, Sr, Mg and Ni. Examples of the organic amine that can form a salt with COOH or $SO_3H$ include, but are not limited to, (mono, di or tri)alkylamines and substituted or unsubstituted alkylamines. As the one or more acid groups in each acid-group-containing compound, sulfonic groups or salts thereof are particularly preferred. Preferably, each acid-group-containing compound contains one sulfonic group per molecule.

As the organic pigment in the second aspect of the present invention, particularly preferred is at least one organic pigment selected from C.I. Pigment Yellow 138, C.I. Pigment Yellow 150, C.I. Pigment Green 7, C.I. Pigment Green 36, C.I. Pigment Red 122 and C.I. Pigment Violet 19.

[First and Second Aspects of the Present Invention]

As the organic pigments for use in the first and second aspects of the present invention, it is preferred, from the viewpoint of providing the resulting pigment composition with improved transparency and vividness, to use an organic pigment the primary particle size of which is 100 nm or smaller or has been reduced to 100 nm or smaller by microgrinding. An a microgrinding method for the pigment, there can be mentioned the salt-milling method that performs milling in the presence of common salt (for example, JP-A-2001-220520 and JP-A-2001-264528), although the microgrinding method is not limited to the salt-milling method.

The pigment compositions according to the first and second embodiments of the present invention can each be produced by mixing the organic pigment and the acid-group-containing compound together by a conventionally-known method (for example, JP-A-2001-271004 and JP-A-2004-091497). Illustrative methods include, but are not limited to, the method that the organic pigment and the acid-group-containing compound are mixed in powder forms with each other, the method that the organic pigment and the acid-group-containing compound are mixed together in suspension forms that they are dispersed in water or an organic solvent having dissolving power, and the method that the acid-group-containing compound is added in desired one of production steps of the organic pigment. As the desired one of the production steps of the organic pigment, salt milling can be mentioned, for example. Examples of the form of the acid-group-containing compound upon its addition include, but are not limited to, powder, paste and suspension forms.

As the proportions of the components in each of the pigment compositions according to the first and second aspects of the present invention, the acid-group-containing compound may be contained preferably in a mixing proportion of from 0.1 to 30 parts by weight, more preferably in a mixing proportion of from 1 to 20 parts by weight per 100 parts by weight of the organic pigment. If the mixing ratio of the acid-group-containing compound is excessively small, it is difficult to fully obtain the intended advantageous effects. Even if its mixing ratio is unduly large, on the other hand, the advantageous effects cannot be brought about in proportion to the unduly large mixing ratio. On the contrary, such an unduly large mixing ratio may become a factor that would provide the resulting pigment composition and the resulting colored composition, which makes use of the pigment composition, with reduced physical properties and also with hues significantly altered from their inherent hues.

As a reason for the effective action of the acid-group-containing compound on the organic pigment in the present invention, the following mechanism is presumable. As the acid-group-containing compound for use in the present invention contains an aromatic ring in its molecule skeleton, it is considered to be effectively adsorbed on the surface of the organic pigment having an organic ring as a skeleton owing to interaction of their $\pi$ electrons. Further, the molecular weight of the acid-group-containing compound is low. Only a reduced steric hindrance is, therefore, considered to arise between the acid-group-containing compound and the organic pigment to permit efficiently adsorption of the acid-group-containing compound. At this time, polar groups such as sulfonic groups or carboxylic groups of the acid-group-containing compound are considered to exist on the surface of the organic pigment on which the acid-group-containing compound is adsorbed. It is, therefore, considered that the negative surface potential of the surface of the pigment increases and under electrostatic repulsive force, the initial pigment dispersibility and the dispersion stability with time both increase.

The acid-group-containing compound can be used in combination with a conventionally-known dispersant, for example, a rosin, a high-molecular dispersant, a surfactant, or a pigment derivative having one or more polar groups introduced therein. Examples of the rosin include, but are not limited to, rosin derivatives, rosin-modified maleic resins, rosin-modified phenol resins, and rosin-modified fumaric resins. Examples of the high-molecular dispersant include, but are not limited to, commercially-available "DISPERBIK 160", "DISPERBIK 161", "DISPERBIK 162", "DISPERBIK 163", "DISPERBIK 164", "DISPERBIK 182" and "DISPERBIK 184" (trade names, products of BYK-Chemie GmbH); "SOLSPERSE 22000", "SOLSPERSE 24000" and "SOLSPERSE 28000" (trade names, products of Avecia Limited United Kingdom); and "DISPARLON DA-234", "DISPARLON DA-325", "DISPARLON DA-375" and "DISPARLON DA-725" (trade names, products of Kusumoto Chemicals, Ltd.). Examples of the pigment derivative include, but are not limited to, commercially-available "SOLSPERSE 5000" and "SOLSPERSE 2200" (trade names, products of Avecia Limited United Kingdom).

The pigment compositions according to the first and second aspects of the present invention can be used as colorants, for example, for various printing inks, sizing colors, binder colors, coating materials, various coating formulations, dry toners and wet toners for electrophotography, thermal transfer recording inks, inks for writing instruments, coating formulations for the formation of color filter pixels, inkjet inks, and the like. Among these applications, the pigment compositions are useful especially for coating formulations for the formation of color filter pixels and inkjet inks, which require high levels of dispersibility, dispersion stability, transparency and vividness.

In general, a coating formulation for the formation of color filter pixels is produced, for example, by adding, to a pigment, a varnish of a photosensitive polyacrylate resin, photosensitive acrylic resin, photosensitive polyamide resin, photosensitive polyimide resin, photosensitive unsaturated polyester resin or the like, or a varnish of such a resin and a monomer or oligomer added further as a reactive diluent, a photopolymerization initiator (if necessary, together with a sensitizer), a solvent, etc. and then subjecting the resultant mixture to high dispersion. The use of the pigment dispersion according to the first or second aspect of the present invention as the pigment in the above-described production makes it possible to obtain a coating formulation for the formulation of color filter pixels, which is excellent in dispersibility, dispersion stability, transparency and vividness.

Examples of the monomer or oligomer include, but are not limited to, (meth)acrylate esters, (meth)acrylic acid, (meth)acrylamides, vinylacetate, styrene, (meth)acrylonitrile, and (meth)acrylate oligomers. Examples of the photopolymerization initiator include, but are not limited to, acetophenone-based photopolymerization initiators, benzoin-based photopolymerization initiators, benzophenone-based photopolymerization initiators, thioxanthone-based photopolymerization initiators, triazine-based photopolymerization initiators, carbazole-based photopolymerization initiators, and imidazole-based photopolymerization initiators. Examples of the sensitizer include, but are not limited to, acylphosphone oxides, methylphenylglyoxylate, quinone-based sensitizers, anthraquinone-based sensitizers, isophthalophenone-based sensitizers, ester-based sensitizers, benzil-based sensitizers, and benzophenone-based sensitizers. Examples of the solvent include, but are not limited to, (poly)alkylene glycol monoalkyl ethers, (poly) alkylene glycol monoalkyl ether acetates, ethers, ketones, alkyl lactates, other esters, aromatic hydrocarbons, and amides.

In general, an inkjet ink is produced, for example, by adding, to a pigment, a liquid medium, specifically water, a water-soluble resin, a surfactant, a water-soluble solvent and the like, and for the purpose of providing improved storability, ejection stability and the like, further adding a surface tension modifier, a viscosity modifier, a specific resistance modifier, a defoaming agent, an antimold and the like, and then subjecting the resultant mixture to high dispersion. The use of the pigment dispersion according to the first or second aspect of the present invention as the pigment in the above-described product ion makes it possible to obtain an inkjet ink, which is excellent indispersibility, dispersion stability, transparency and vividness.

Examples of the water-soluble resin include, but are not limited to, acrylic resins, acrylic-styrene resins, polyester resins, polyamide resins, and polyurethane resins. Examples of the surfactant include, but are not limited to, anionic surfactants, nonionic surfactants, amphoteric surfactants, and cationic surfactants. Examples of the water-soluble solvent include, but are not limited to, alcohols, polyhydric alcohols, polyhydric alcohol ethers, amines, heterocycles, sulfoxides, sulfones, and acetonitriles.

EXAMPLES

The present invention will next be described more specifically on the basis of Synthesis Examples, Examples and Comparative Examples.

[First and Third to Sixth Aspects of the Present Invention]

Synthesis Examples of Acid-Group-Containing Compounds

2-Amino-4-methyl-5-chlorobenzenesulfonic acid (20.5 parts) as a diazo component and 2-hydroxy-3-phenylcarbamoylnaphthalene (27.0 parts) as a coupler component were reacted by a method known per se in the art to obtain an acid-group-containing compound I-A (45.0 parts) described below in Table I-1.

In a similar manner as in the synthesis example of the acid-group-containing compound I-A except that the diazo component and coupler component were changed, reactions were conducted to obtain acid-group-containing compounds I-B to I-J described below in Table I-1.

An overview of the synthesis results is shown in Table I-1.

TABLE I-1

| Name of acid-group-containing compound | Diazo component | Coupler component |
|---|---|---|
| I-A | 2-Amino-4-methyl-5-chlorobenzenesulfonic acid | 2-Hydroxy-3-phenylcarbamoyl-naphthalene |
| I-B | 3-Amino-6-chloro-benzenesulfonic acid | 2-Hydroxy-3-phenylcarbamoyl-naphthalene |
| I-C | 2-Amino-4-methyl-5-chlorobenzenesulfonic acid | 2-Hydroxy-3-(2-methylphenyl-carbamoyl)naphthalene |
| I-D | 3-Amino-6-chloro-benzenesulfonic acid | 2-Hydroxy-3-(2-methylphenyl-carbamoyl)naphthalene |
| I-E | 2-Amino-4-methyl-5-chlorobenzenesulfonic acid | 2-Hydroxy-3-(4-chlorophenyl-carbamoyl)naphthalene |
| I-F | 3-Amino-4-methoxy-benzamide | 2-Hydroxy-3-naphthoic acid anilide-4'-sulfonic acid |
| I-G | 2-Amino-4-nitro-toluene | 2-Hydroxy-3-naphthoic acid anilide-4'-sulfonic acid |
| I-H | 2-Aminonaphthalene-sulfonic acid | 2-Hydroxy-3-phenylcarbamoyl-naphthalene |
| I-I | 1-Amino-4-bromo-anthraquinone-2-sulfonic acid | 2-Hydroxy-3-phenylcarbamoyl-naphthalene |
| I-J | α-Aminoanthraquinone | 2-Hydroxy-3-naphthoic acid anilide-4'-sulfonic acid |

Example I of Pigment Composition

Example I-1

To a water-based suspension containing C.I. Pigment Red 254 (20 parts) as a pigment, a water-based suspension containing the acid-group-containing compound I-A (3 parts) was added. After the suspension mixture was stirred for 30 minutes, the suspension mixture was filtered and the filter cake was washed with water. The thus-obtained pigment paste was dried for 24 hours, followed by grinding to obtain the target pigment composition (21 parts).

Example I-2

Production of a pigment composition was conducted in a similar manner as in Example I-1 except for the use of the acid-group-containing compound I-B in place of the acid-group-containing compound I-A.

Example I-3

Production of a pigment composition was conducted in a similar manner as in Example I-1 except for the use of the acid-group-containing compound I-C in place of the acid-group-containing compound I-A.

Example I-4

Production of a pigment composition was conducted in a similar manner as in Example I-1 except for the use of the acid-group-containing compound I-D in place of the acid-group-containing compound I-A.

Example I-5

Production of a pigment composition was conducted in a similar manner as in Example I-1 except for the use of the acid-group-containing compound I-E in place of the acid-group-containing compound I-A.

Example I-6

Production of a pigment composition was conducted in a similar manner as in Example I-1 except for the use of the acid-group-containing compound I-F in place of the acid-group-containing compound I-A.

Example I-7

Production of a pigment composition was conducted in a similar manner as in Example I-1 except for the use of the acid-group-containing compound I-G in place of the acid-group-containing compound I-A.

Example I-8

Production of a pigment composition was conducted in a similar manner as in Example I-1 except for the use of the acid-group-containing compound I-H in place of the acid-group-containing compound I-A.

Comparative Example I-1

An untreated pigment was obtained following the procedure of Examples I-1 without the addition of the acid-group-containing compound I-A.

Example I-9

To a water-based suspension containing C.I. Pigment Red 177 (35 parts) as a pigment, a water-based suspension containing the acid-group-containing compound I-H (3.5 parts) was added. After the suspension mixture was stirred for 30 minutes, the suspension mixture was filtered and the filter cake was washed with water. The thus-obtained pigment paste was dried for 24 hours, followed by grinding to obtain the target pigment composition (36 parts).

Example I-10

Production of a pigment composition was conducted in a similar manner as in Example I-9 except for the use of the acid-group-containing compound I-J in place of the acid-group-containing compound I-H.

Example I-11

Production of a pigment composition was conducted in a similar manner as in Example I-9 except for the use of the acid-group-containing compound I-J in place of the acid-group-containing compound I-H.

Comparative Example I-2

An untreated pigment was obtained following the procedure of Examples I-9 without the addition of the acid-group-containing compound I-H.

[Preparation, Testing and Assessment of Coating Formulations for the Formation of Color Filter Pixels]

As will be described hereinafter, coating formulations for the formation of color filter pixels were prepared by using the pigment compositions prepared in Examples I-1 to I-11 and the untreated pigments prepared in Comparative Examples I-1 and I-2, and they were tested for viscosity, storage stability, and lightness and chroma.

[Preparation of Coating Formulations for the Formation of Color Filter Pixels]

Example I-12

Zirconia beads (180 parts) were placed in a 250-mL glass bottle, followed by the addition of the pigment composition prepared in Example I-1, an acrylic resin, a high molecular dispersant and propylene glycol monoacetate (PGM-Ac). They were shortly premixed, and were then dispersed for 3 hours in a paint conditioner to obtain a dispersion (100.0 parts). The dispersion obtained as described above, an acrylic resin, dipentaerythritol hexaacrylate, 2-benzyl-2-dimethylamino-1-(4-morpholinophenyl)butanone-1,2,4-diethylthioxanthone and PGM-Ac were added to a 250-mL glass bottle. Subsequent to thorough mixing, the resultant mixture was filtered through a membrane filter to obtain a liquid formulation for the formation of color filter pixels (150.0 parts). For the detailed compositions of the dispersion and coating formulation, see the following tables.

| Material | Added amount (parts) |
|---|---|
| Pigment composition or untreated pigment | 12.0 |
| Acrylic resin (solid content: 30%) | 7.0 |
| High-molecular dispersant (solid content: 25%) | 5.0 |
| PGM-Ac | 76.0 |
| Total | 100.0 |

| Material | Added amount (parts) |
|---|---|
| Dispersion | 50.0 |
| Acrylic resin (solid content: 30%) | 55.0 |
| Dipentaerythritol hexaacrylate | 6.0 |
| 2-Benzyl-2-dimethylamino-1-(4-morpholino-phenyl)butanone-1 | 2.0 |
| 2,4-Diethylthioxanthone | 1.0 |
| PGM-Ac | 36.0 |
| Total | 150.0 |

Example I-13

Production of a coating formulation for the formation of color filter pixels was conducted in a similar manner as in Example I-12 except that the pigment composition prepared in Example I-2 was used in place of the pigment composition prepared in Example I-1.

Example I-14

Production of a coating formulation for the formation of color filter pixels was conducted in a similar manner as in Example I-12 except that the pigment composition prepared in Example I-3 was used in place of the pigment composition prepared in Example I-1.

Example I-15

Production of a coating formulation for the formation of color filter pixels was conducted in a similar manner as in Example I-12 except that the pigment composition prepared in Example I-9 was used in place of the pigment composition prepared in Example I-1.

Example I-16

Production of a coating formulation for the formation of color filter pixels was conducted in a similar manner as in Example I-12 except that the pigment composition prepared in Example I-5 was used in place of the pigment composition prepared in Example I-1.

Example I-17

Production of a coating formulation for the formation of color filter pixels was conducted in a similar manner as in Example I-12 except that the pigment composition prepared in Example I-6 was used in place of the pigment composition prepared in Example I-1.

Example I-18

Production of a coating formulation for the formation of color filter pixels was conducted in a similar manner as in Example I-12 except that the pigment composition prepared in Example I-7 was used in place of the pigment composition prepared in Example I-1.

Example I-19

Production of a coating formulation for the formation of color filter pixels was conducted in a similar manner as in Example I-12 except that the pigment composition prepared in Example I-8 was used in place of the pigment composition prepared in Example I-1.

Comparative Example I-3

Production of a coating formulation for the formation of color filter pixels was conducted in a similar manner as in Example I-12 except that the untreated pigment prepared in Comparative Example I-1 was used in place of the pigment composition prepared in Example I-1.

Example I-20

Zirconia beads (200 parts) were placed in a 250-mL glass bottle, followed by the addition of the pigment composition prepared in Example I-9, an acrylic resin, a high molecular dispersant and PGM-Ac. They were shortly premixed, and were then dispersed for 3 hours in a paint conditioner to obtain a dispersion (100.0 parts). The dispersion obtained as described above, an acrylic resin, dipentaerythritol hexaacrylate, 2-benzyl-2-dimethylamino-1-(4-morpholinophenyl)butanone-1,2,9-diethylthioxanthone and PGM-Ac were added to a 250-mL glass bottle. Subsequent to thorough mixing, the resultant mixture was filtered through a membrane filter to obtain a liquid formulation for the formation of color filter pixels (150.0 parts). For the detailed compositions of the dispersion and coating formulation, see the following tables.

| Material | Added amount (parts) |
| --- | --- |
| Pigment composition or untreated pigment | 13.0 |
| Acrylic resin (solid content: 30%) | 8.5 |
| High-molecular dispersant (solid content: 25%) | 4.5 |
| PGM-Ac | 74.0 |
| Total | 100.0 |

| Material | Added amount (parts) |
| --- | --- |
| Dispersion | 50.0 |
| Acrylic resin (solid content: 30%) | 55.0 |
| Dipentaerythritol hexaacrylate | 6.0 |
| 2-Benzyl-2-dimethylamino-1-(4-morpholinophenyl)butanone-1 | 2.0 |
| 2,4-Diethylthioxanthone | 1.0 |
| PGM-Ac | 36.0 |
| Total | 150.0 |

Example I-21

Production of a coating formulation for the formation of color filter pixels was conducted in a similar manner as in Example I-20 except that the pigment composition prepared in Example I-10 was used in place of the pigment composition prepared in Example I-9.

Example I-22

Production of a coating formulation for the formation of color filter pixels was conducted in a similar manner as in Example I-20 except that the pigment composition prepared in Example I-11 was used in place of the pigment composition prepared in Example I-9.

Comparative Example I-4

Production of a coating formulation for the formation of color filter pixels was conducted in a similar manner as in Example I-20 except that the untreated pigment prepared in Comparative Example I-2 was used in place of the pigment composition prepared in Example I-9.

[Testing and Assessment of the Coating Formulations for the Formation of Color Filter Pixels]

<Viscosity and Storage Stability>

The coating formulations for the formation of color filter pixels, which had been obtained in Examples I-12 to I-22 and Comparative Examples I-3 and I-4, were separately allowed to stand at 25° C. for 1 hour. Subsequently, the viscosity of each coating formulation was measured using a Brookfield rotational viscometer ("BL Model", trade name; manufactured by TOKIMEC INC.; value at 30 rpm), and the measurement value was recorded as an initial viscosity. Subsequent to the measurement of the initial viscosity, the same sample was held at 25° C. for 1 week and its viscosity with time was measured in a similar manner as in the measurement of the initial viscosity. Its storage stability was ranked in accordance with the following 4-stage assessment standards: A: storage stability of absolutely no problem level, B: storage stability of usable level, C: storage stability of somewhat questionable level for use due to thickening, and D: storage stability of unusable level due to significant thickening.

<Lightness and Chroma>

The coating formulations for the formation of color filter pixels, which had been obtained in Examples I-12 to I-22 and Comparative Examples I-3 and I-4, were each dropped in an appropriate amount onto a center of a glass plate set on a spin coater (manufactured by ABLE Ltd.) to coat the coating formulation over the glass plate. Subsequently, pre-baking was conducted. Using a spectrocalorimeter (Model: "CM-3600d" (trade name); manufactured by KONICA MINOLTA JAPAN), the thus-prepared glass plate was measured for its chromaticy at a vertical view angle of 2 degrees by the CIE standard illuminant C to determine its (Y,x,y) values in the CIE standard colorimetric system and further to calculate its contrast. Supposing that the contrast values of Comparative Examples I-3 and I-4 were 100%, respectively, the contrast values of Examples I-12 to I-22 were converted into relative contrasts.

The results of the above tests are shown in Table I-2 and Table I-3.

TABLE I-2

| Example/ Comp. Ex. | Pigment | Acid-group-containing compound | Initial viscosity | Viscosity with time | Storage stability | Relative contrast |
| --- | --- | --- | --- | --- | --- | --- |
| Ex. I-12 | C.I. Pigment Red 254 | I-A | 8 | 8.5 | A | 123% |
| Ex. I-13 | C.I. Pigment Red 254 | I-B | 9 | 9 | A | 120% |
| Ex. I-14 | C.I. Pigment Red 254 | I-C | 9 | 10 | A | 118% |
| Ex. I-15 | C.I. Pigment Red 254 | I-D | 8 | 10 | B | 130% |
| Ex. I-16 | C.I. Pigment Red 254 | I-E | 9 | 9 | A | 120% |
| Ex. I-17 | C.I. Pigment Red 254 | I-F | 9 | 9 | A | 110% |
| Ex. I-18 | C.I. Pigment Red 254 | I-G | 9 | 10 | A | 115% |

TABLE I-2-continued

| Example/ Comp. Ex. | Pigment | Acid-group-containing compound | Initial viscosity | Viscosity with time | Storage stability | Relative contrast |
|---|---|---|---|---|---|---|
| Ex. I-19 | C.I. Pigment Red 254 | I-H | 10 | 12 | B | 115% |
| Comp. Ex. I-3 | C.I. Pigment Red 254 | None | 17 | 29 | C | 100% |

(unit of viscosity: mPa · s)

TABLE I-3

| Example/ Comp. Ex. | Pigment | Acid-group-containing compound | Initial viscosity | Viscosity with time | Storage stability | Relative contrast |
|---|---|---|---|---|---|---|
| Ex. I-20 | C.I. Pigment Red 177 | I-H | 8 | 10 | B | 120% |
| Ex. I-21 | C.I. Pigment Red 177 | I-I | 7 | 8 | A | 120% |
| Ex. I-22 | C.I. Pigment Red 177 | I-J | 6 | 7 | A | 125% |
| Comp. Ex. I-4 | C.I. Pigment Red 177 | None | 11 | 20 | C | 100% |

(unit of viscosity: mPa · s)

Table I-2 and Table I-3 show the assessment results of the coating formulations for the formation of color filter pixels, in which the corresponding acid-group-containing compounds had been added, and those containing no acid-group-containing compound added therein. The coating formulations according to the present invention for the formation of color filter pixels, which made use of the corresponding acid-group-containing compounds, had lower initial viscosities than the coating formulations making use of no acid-group-containing compound. The coating formulations according to the present invention were not observed to undergo any substantial viscosity change with time, and therefore, were excellent in storage stability. In the values of relative contrast, Examples I-12 to I-19 were higher by 10 to 30% than Comparative Example I-3, and Examples I-20 to I-22 were higher by 20 to 25% than Comparative Example I-4.

Example I of Pigment Composition

Example I-23

To a water-based suspension containing C.I. Pigment Red 122 (30 parts) as a pigment, a water-based suspension containing the acid-group-containing compound I-A (1.5 parts) was added. After the suspension mixture was stirred for 15 minutes, the suspension mixture was filtered and the filter cake was washed with water. The thus-obtained pigment paste was dried for 24 hours, followed by grinding to obtain the target pigment composition (27 parts).

Comparative Example I-5

An untreated pigment was obtained following the procedure of Examples I-23 without the addition of the acid-group-containing compound I-A.

[Preparation, Testing and Assessment of Inkjet Inks]

As will be described hereinafter, inkjet inks were prepared by using the pigment composition prepared in Example I-23 and the untreated pigment prepared in Comparative Example I-5, and they were tested for dispersed particle size, viscosity, storage stability, and lightness and chroma.

[Preparation of Inkjet Inks]

Example I-24

Zirconia beads (120 parts) were placed in a 250-mL glass bottle, followed by the addition of the pigment composition prepared in Example I-23, a water-soluble styrene-acrylic resin and deionized water. They were shortly premixed, and were then dispersed for 5 hours in a paint conditioner to obtain a dispersion (60.0 parts). The dispersion obtained as described above, triethylene glycol monobutyl ether, glycerin, "SUREYNOL" (trademark, product of Air Products Japan, Inc.; defoaming agent), deionized water, methanol, and a 10% aqueous solution of glycerylated chitosan (deacetylation degree: 80%, degree of glyceryl substitution: 1.1) were added to a 250-mL glass bottle. Subsequent to thorough mixing, the resultant mixture was filtered through a membrane filter of 5-μm pore size to obtain an inkjet ink (100.0 parts). For the detailed compositions of the dispersion and inkjet ink, see the following tables.

| Material | Added amount (parts) |
|---|---|
| Pigment composition or untreated pigment | 10.0 |
| Water-soluble styrene-acrylic resin (solid content: 45%) | 5.0 |
| Deionized water | 45.0 |
| Total | 60.0 |

| Material | Added amount (parts) |
|---|---|
| Dispersion | 40.0 |
| Triethylene glycol monobutyl ether | 5.0 |
| Glycerin | 5.0 |
| "SURFYNOL" | 0.5 |
| Methanol | 0.5 |

-continued

| Material | Added amount (parts) |
| --- | --- |
| 10% Aq. solution of glycerylated chitosan | 8.0 |
| Deionized water | 41.0 |
| Total | 100.0 |

Comparative Example I-6

Production of an inkjet ink was conducted in a similar manner as in Example I-24 except that the untreated pigment prepared in Comparative Example I-5 was used in place of the pigment composition prepared in Example I-23.

[Testing and Assessment of the Inkjet Inks]

<Dispersed Particle Size and Particle Size Stability>

The inkjet inks obtained in Example I-24 and Comparative Example I-6 were each allowed to stand at 25° C. for 1 hour. Using a laser scattering particle size distribution analyzer ("N5 SUBMICRON PARTICLE SIZE ANALYZER", trade name; manufactured by Beckmann Coulter GmbH), the average particle size of the pigment in each inkjet ink was then measured, and the measurement value was recorded as an initial particle size. After the inkjet ink was held at 50° C. for 10 days, the average particle size of the pigment in the ink was measured in a similar manner as in the measurement of the initial particle size, and the measurement value was recorded as a particle size with time. The particle size stability of each inkjet ink was ranked in accordance with the following two-stage assessment standards: A: the ratio ($\phi2/\phi1$) of the particle size with time ($\phi2$) to the initial particle size ($\phi1$)$\leq$1.5, and B: $\phi2/\phi1>1.5$.

<Viscosity and Storage Stability>

The inkjet inks obtained in Example I-24 and Comparative Example I-6 were each allowed to stand at 25° C. for 1 hour. Subsequently, the viscosity of the inkjet ink was measured using an E-type viscometer ("RE80 Model", trade name; manufactured by Tokyo Industry Co., Ltd.; value at 50 rpm), and the measurement value was recorded as an initial viscosity. Subsequent to the measurement of the initial viscosity, the same sample was held at 50° C. for 10 days and its viscosity with time was measured in a similar manner as in the measurement of the initial viscosity. Its storage stability was ranked in accordance with the following 2-stage assessment standards: A: the ratio ($\eta2/\eta1$) of the viscosity with time ($\eta2$) to the initial viscosity ($\eta1$)$\leq$2.0, and B: $\eta2/\eta1>2.0$.

<Color Hue and Transparency>

Each inkjet ink prepared as described above was spread over a sheet of hiding power test paper (product of Nippon Testpanel Co., Ltd.) by a bar coater (gauge No. 6), and its 60 deg. gloss was measured by a gloss meter ("HAZE GLOSS-METER", trade name; manufactured by BYK-Chemie GmbH). The inkjet ink was also spread over a commercial OHP film for inkjet recording by a bar coater (gauge No. 6), and its transparency was visually assessed. The assessment results were ranked in accordance with the following 3-stage standards: A: high transparency, B: semi-transparency, and C: no transparency.

The above test results are shown in Tables I-4 and I-5.

TABLE I-4

| | Example I-24 | Comp. Ex. I-6 |
| --- | --- | --- |
| Initial particle size | 87 | 103 |
| Particle size with time | 96 | 185 |
| Particle size stability | A | B |
| Initial viscosity | 12.5 | 15.6 |
| Viscosity with time | 13.7 | 36.1 |
| Storage stability | A | B |

(unit of particle size: nm, unit of viscosity: mPa · s)

TABLE I-5

| | Example I-24 | Comp. Ex. I-6 |
| --- | --- | --- |
| Gloss | 66 | 59 |
| Transparency | A | B |

(unit of gloss: %)

The inkjet ink according to the present invention, which made use of the acid-group-containing compound, had a small initial particle size and showed excellent particle size stability with time that remained substantially unchanged with time. Concerning fluidity, it also showed a low initial viscosity and excellent viscosity stability with time. Compared with the comparative product, it was also excellent in transparency and had a high gloss.

[Second to Sixth Aspects of the Present Invention]

Synthesis Examples of Acid-Group-Containing Compounds

2-Amino-4-methyl-5-chlorobenzenesulfonic acid (21.0 parts) as a diazo component and acetoacetic acid anilide (27.5 parts) as a coupler component were reacted by a method known per se in the art to obtain an acid-group-containing compound II-A (45.5 parts) described below in Table II-1.

In a similar manner as in the synthesis example of the acid-group-containing compound II-A except that the diazo component and coupler component were changed, reactions were conducted to obtain acid-group-containing compounds II-B to II-G described below in Table II-1.

An overview of the synthesis results is shown in Table II-1.

TABLE II-1

| Name of acid-group-containing compound | Diazo component | Coupler component |
| --- | --- | --- |
| II-A | 2-Amino-4-methyl-5-chlorobenzenesulfonic acid | Acetoacetic acid anilide |
| II-B | 3-Amino-6-chloro-benzenesulfonic acid | Acetoacetic acid-o-toluidide |
| II-C | 4-Aminobenzene-sulfonic acid | Acetoacetic acid-o-anisidide |
| II-D | 3-Amino-4-methoxy benzenanilide | Acetoaceto-4-sulfanilic acid |
| II-E | 3-Amino-4-methoxy-benzenanilide | Acetoaceto-2-methyl-4-sulfanilic acid |
| II-F | 2-Aminonaphthalene-sulfonic acid | Acetoacetic acid anilide |
| II-G | 1-Amino-4-bromo-anthraquinone-2-sulfonic acid | Acetoacetic acid anilide |

Example II of Pigment Composition

Example II-1

To a water-based suspension containing C.I. Pigment Yellow 138 (20 parts) as a pigment, a water-based suspension containing the acid-group-containing compound II-A (3 parts) was added. After the suspension mixture was stirred for 30 minutes, the suspension mixture was filtered and the filter cake was washed with water. The thus-obtained pigment paste was dried for 24 hours, followed by grinding to obtain the target pigment composition (21 parts).

Example II-2

Production of a pigment composition was conducted in a similar manner as in Example II-1 except for the use of the acid-group-containing compound II-B in place of the acid-group-containing compound II-A.

Example II-3

Production of a pigment composition was conducted in a similar manner as in Example II-1 except for the use of the acid-group-containing compound II-C in place of the acid-group-containing compound II-A.

Example II-4

Production of a pigment composition was conducted in a similar manner as in Example II-1 except for the use of the acid-group-containing compound II-D in place of the acid-group-containing compound II-A.

Example II-5

Production of a pigment composition was conducted in a similar manner as in Example II-1 except for the use of the acid-group-containing compound II-E in place of the acid-group-containing compound II-A.

Example II-6

Production of a pigment composition was conducted in a similar manner as in Example II-1 except for the use of the acid-group-containing compound II-F in place of the acid-group-containing compound II-A.

Example II-7

Production of a pigment composition was conducted in a similar manner as in Example II-1 except for the use of the acid-group-containing compound II-G in place of the acid-group-containing compound II-A.

Comparative Example II-1

An untreated pigment was obtained following the procedure of Examples II-1 without the addition of the acid-group-containing compound II-A.

Example II-8

To a water-based suspension containing C.I. Pigment Green 36 (20 parts) as a pigment, a water-based suspension containing the acid-group-containing compound II-A (2.4 parts) was added. After the suspension mixture was stirred for 30 minutes, the suspension mixture was filtered and the filter cake was washed with water. The thus-obtained pigment paste was dried for 24 hours, followed by grinding to obtain the target pigment composition (21 parts).

Example II-9

Production of a pigment composition was conducted in a similar manner as in Example II-8 except for the use of the acid-group-containing compound II-D in place of the acid-group-containing compound II-A.

Example II-10

Production of a pigment composition was conducted in a similar manner as in Example II-8 except for the use of the acid-group-containing compound II-E in place of the acid-group-containing compound II-A.

Example II-11

Production of a pigment composition was conducted in a similar manner as in Example II-8 except for the use of the acid-group-containing compound II-F in place of the acid-group-containing compound II-A.

Example II-12

Production of a pigment composition was conducted in a similar manner as in Example II-8 except for the use of the acid-group-containing compound II-G in place of the acid-group-containing compound II-A.

Comparative Example II-2

An untreated pigment was obtained following the procedure of Examples II-8 without the addition of the acid-group-containing compound II-A.

[Preparation, Testing and Assessment of Coating Formulations for the Formation of Color Filter Pixels]

As will be described hereinafter, coating formulations for the formation of color filter pixels were prepared by using the pigment compositions prepared in Examples II-1 to II-12 and the untreated pigments prepared in Comparative Examples II-1 and II-2, and they were tested for viscosity, storage stability, and lightness and chroma.

[Preparation of Coating Formulations for the Formation of Color Filter Pixels]

Example II-13

Zirconia beads (180 parts) were placed in a 250-mL glass bottle, followed by the addition of the pigment composition prepared in Example II-1, an acrylic resin, a high molecular dispersant and propylene glycol monoacetate (PGM-Ac). They were shortly premixed, and were then dispersed for 3 hours in a paint conditioner to obtain a dispersion (100.0 parts). The dispersion obtained as described above, an acrylic resin, dipentaerythritol hexaacrylate, 2-benzyl-2-dimethylamino-1-(4-morpholinophenyl)butanone-1,2,1-diethylthioxanthone and PGM-Ac were added to a 250-mL glass bottle. Subsequent to thorough mixing, the resultant mixture was filtered through a membrane filter to obtain a liquid formulation for the formation of color filter pixels (150.0 parts). For the detailed compositions of the dispersion and coating formulation, see the following tables.

| Material | Added amount (parts) |
| --- | --- |
| Pigment composition or untreated pigment | 12.0 |
| Acrylic resin (solid content: 30%) | 7.0 |
| High-molecular dispersant (solid content: 25%) | 5.0 |
| PGM-Ac | 76.0 |
| Total | 100.0 |

| Material | Added amount (parts) |
| --- | --- |
| Dispersion | 50.0 |
| Acrylic resin (solid content: 30%) | 55.0 |
| Dipentaerythritol hexaacrylate | 6.0 |
| 2-Benzyl-2-dimethylamino-1-(4-morpholino-phenyl)butanone-1 | 2.0 |
| 2,4-Diethylthioxanthone | 1.0 |
| PGM-Ac | 36.0 |
| Total | 150.0 |

Example I-14

Production of a coating formulation for the formation of color filter pixels was conducted in a similar manner as in Example II-13 except that the pigment composition prepared in Example II-2 was used in place of the pigment composition prepared in Example II-1.

Example I-15

Production of a coating formulation for the formation of color filter pixels was conducted in a similar manner as in Example II-13 except that the pigment composition prepared in Example II-3 was used in place of the pigment composition prepared in Example II-1.

Example I-16

Production of a coating formulation for the formation of color filter pixels was conducted in a similar manner as in Example II-13 except that the pigment composition prepared in Example II-4 was used in place of the pigment composition prepared in Example II-1.

Example I-17

Production of a coating formulation for the formation of color filter pixels was conducted in a similar manner as in Example II-13 except that the pigment composition prepared in Example II-5 was used in place of the pigment composition prepared in Example II-1.

Example I-18

Production of a coating formulation for the formation of color filter pixels was conducted in a similar manner as in Example II-13 except that the pigment composition prepared in Example II-6 was used in place of the pigment composition prepared in Example II-1.

Example I-19

Production of a coating formulation for the formation of color filter pixels was conducted in a similar manner as in Example II-13 except that the pigment composition prepared in Example II-7 was used in place of the pigment composition prepared in Example II-1.

Example I-20

Production of a coating formulation for the formation of color filter pixels was conducted in a similar manner as in Example II-13 except that the pigment composition prepared in Example II-8 was used in place of the pigment composition prepared in Example II-1.

Example I-21

Production of a coating formulation for the formation of color filter pixels was conducted in a similar manner as in Example II-13 except that the pigment composition prepared in Example II-9 was used in place of the pigment composition prepared in Example II-1.

Example I-22

Production of a coating formulation for the formation of color filter pixels was conducted in a similar manner as in Example II-13 except that the pigment composition prepared in Example II-10 was used in place of the pigment composition prepared in Example II-1.

Example I-23

Production of a coating formulation for the formation of color filter pixels was conducted in a similar manner as in Example II-13 except that the pigment composition prepared in Example II-11 was used in place of the pigment composition prepared in Example II-1.

Example I-24

Production of a coating formulation for the formation of color filter pixels was conducted in a similar manner as in Example II-13 except that the pigment composition prepared in Example II-12 was used in place of the pigment composition prepared in Example II-1.

Comparative Example II-3

Production of a coating formulation for the formation of color filter pixels was conducted in a similar manner as in Example II-13 except that the untreated pigment prepared in Comparative Example II-1 was used in place of the pigment composition prepared in Example II-1.

Comparative Example II-4

Production of a coating formulation for the formation of color filter pixels was conducted in a similar manner as in Example II-13 except that the untreated pigment prepared in Comparative Example II-2 was used in place of the pigment composition prepared in Example II-1.

[Testing and Assessment of the Coating Formulations for the Formation of Color Filter Pixels]

<Viscosity and Storage Stability>

The coating formulations for the formation of color filter pixels, which had been obtained in Examples II-13 to II-24 and Comparative Examples II-3 and II-4, were separately allowed to stand at 25° C. for 1 hour. Subsequently, the viscosity of each coating formulation was measured using a Brookfield rotational viscometer ("BL Model", trade name; manufactured by TOKIMEC INC.; value at 30 rpm), and the measurement value was recorded as an initial viscosity. Subsequent to the measurement of the initial viscosity, the same sample was held at 25° C. for 1 week and its viscosity with time was measured in a similar manner as in the measurement of the initial viscosity. Its storage stability was ranked in accordance with the following 4-stage assessment standards: A: storage stability of absolutely no problem level, B: storage stability of usable level, C: storage stability of somewhat questionable level for use due to thickening, and D: storage stability of unusable level due to significant thickening.

<Lightness and Chroma>

The coating formulations for the formation of color filter pixels, which had been obtained in Examples II-13 to II-24 and Comparative Examples II-3 and II-4, were each dropped in an appropriate amount onto a center of a glass plate set on a spin coater (manufactured by ABLE Ltd.) to coat the coating formulation over the glass plate. Subsequently, pre-baking was conducted. Using a spectrocalorimeter (Model: "CM-3600d" (trade name); manufactured by KONICA MINOLTA JAPAN), the thus-prepared glass plate was measured for its chromaticy at a vertical view angle of 2 degrees by the CIE standard illuminant C to determine its (Y,x,y) values in the CIE standard colorimetric system and further to calculate its contrast. Supposing that the contrast values of Comparative Examples II-3 and II-4 were 100%, respectively, the contrast values of Examples II-13 to II-24 were converted into relative contrasts.

The results of the above tests are shown in Table II-2 and Table II-3.

TABLE II-2

| Example/ Comp. Ex. | Pigment | Acid-group-containing compound | Initial viscosity | Viscosity with time | Storage stability | Relative contrast |
| --- | --- | --- | --- | --- | --- | --- |
| Ex. II-13 | C.I. Pigment Yellow 138 | II-A | 5 | 5 | A | 115% |
| Ex. II-14 | C.I. Pigment Yellow 138 | II-B | 5.5 | 6 | A | 120% |
| Ex. II-15 | C.I. Pigment Yellow 138 | II-C | 4 | 5 | A | 118% |
| Ex. II-16 | C.I. Pigment Yellow 138 | II-D | 5 | 5 | A | 110% |
| Ex. II-17 | C.I. Pigment Yellow 138 | II-E | 5 | 6 | A | 130% |
| Ex. II-18 | C.I. Pigment Yellow 138 | II-F | 5 | 5.5 | A | 115% |
| Ex. II-19 | C.I. Pigment Yellow 138 | II-G | 5.5 | 5.5 | A | 120% |
| Comp. Ex. II-3 | C.I. Pigment Yellow 138 | None | 20 | 48 | C | 100% |

(unit of viscosity: mPa · s)

TABLE II-3

| Example/ Comp. Ex. | Pigment | Acid-group-containing compound | Initial viscosity | Viscosity with time | Storage stability | Relative contrast |
| --- | --- | --- | --- | --- | --- | --- |
| Ex. II-20 | C.I. Pigment Green 36 | II-A | 5 | 7 | A | 120% |
| Ex. II-21 | C.I. Pigment Green 36 | II-D | 5 | 6 | A | 110% |
| Ex. II-22 | C.I. Pigment Green 36 | II-E | 6 | 6 | A | 105% |
| Ex. II-23 | C.I. Pigment Green 36 | II-F | 5 | 8 | B | 110% |
| Ex. II-24 | C.I. Pigment Green 36 | II-G | 5 | 8.5 | B | 120% |
| Comp. Ex. II-4 | C.I. Pigment Green 36 | None | 17 | 41 | C | 100% |

(unit of viscosity: mPa · s)

Table II-2 and Table II-3 show the assessment results of the coating formulations for the formation of color filter pixels, in which the corresponding acid-group-containing compounds had been added, and those containing no acid-group-containing compound added therein. The coating formulations according to the present invention for the formation of color filter pixels, which made use of the corresponding acid-group-containing compounds, had lower initial viscosities than the coating formulations making use of no acid-group-containing compound. The coating formulations according to the present invention were not observed to undergo any substantial viscosity change with time, and therefore, were excellent in storage stability. In the values of relative contrast, Examples II-13 to II-24 were higher by 5 to 30% than Comparative Example II-3 or II-4.

Example II of Pigment Composition

Example II-25

To a water-based suspension containing C.I. Pigment Red 122 (30 parts) as a pigment, a water-based suspension containing the acid-group-containing compound II-A (1.5 parts) was added. After the suspension mixture was stirred for 15 minutes, the suspension mixture was filtered and the filter cake was washed with water. The thus-obtained pigment paste was dried for 24 hours, followed by grinding to obtain the target pigment composition (27 parts).

Comparative Example II-5

An untreated pigment was obtained following the procedure of Examples II-25 without the addition of the acid-group-containing compound II-A.

[Preparation, Testing and Assessment of Inkjet Inks]

As will be described hereinafter, inkjet inks were prepared by using the pigment composition prepared in Example II-25 and the untreated pigment prepared in Comparative Example II-5, and they were tested for dispersed particle size, viscosity, storage stability, and lightness and chroma.

[Preparation of Inkjet Inks]

Example II-26

Zirconia beads (120 parts) were placed in a 250-mL glass bottle, followed by the addition of the pigment composition prepared in Example II-25, a water-soluble styrene-acrylic resin and deionized water. They were shortly premixed, and were then dispersed for 5 hours in a paint conditioner to obtain a dispersion (60.0 parts). The dispersion obtained as described above, triethylene glycol monobutyl ether, glycerin, "SURFYNOL" (trademark, product of Air Products Japan, Inc.; defoaming agent), deionized water, methanol, and a 10% aqueous solution of glycerylated chitosan (deacetylation degree: 80%, degree of glyceryl substitution: 1.1) were added to a 250-mL glass bottle. Subsequent to thorough mixing, the resultant mixture was filtered through a membrane filter of 5-μm pore size to obtain an inkjet ink (100.0 parts). For the detailed compositions of the dispersion and inkjet ink, see the following tables.

| Material | Added amount (parts) |
| --- | --- |
| Pigment composition or untreated pigment | 10.0 |
| Water-soluble styrene-acrylic resin (solid content: 45%) | 5.0 |
| Deionized water | 45.0 |
| Total | 60.0 |

| Material | Added amount (parts) |
| --- | --- |
| Dispersion | 40.0 |
| Triethylene glycol monobutyl ether | 5.0 |
| Glycerin | 5.0 |
| "SURFYNOL" | 0.5 |
| Methanol | 0.5 |
| 10% Aq. solution of glycerylated chitosan | 8.0 |
| Deionized water | 41.0 |
| Total | 100.0 |

Comparative Example II-6

Production of an inkjet ink was conducted in a similar manner as in Example II-26 except that the untreated pigment prepared in Comparative Example II-5 was used in place of the pigment composition prepared in Example II-25.

[Testing and Assessment of the Inkjet Inks]

<Dispersed Particle Size and Particle Size Stability>

The inkjet inks obtained in Example II-26 and Comparative Example II-6 were each allowed to stand at 25° C. for 1 hour. Using a laser scattering particle size distribution analyzer ("N5 SUBMICRON PARTICLE SIZE ANALYZER", trade name; manufactured by Beckmann Coulter GmbH), the average particle size of the pigment in each inkjet ink was then measured, and the measurement value was recorded as an initial particle size. After the inkjet ink was held at 50° C. for 10 days, the average particle size of the pigment in the ink was measured in a similar manner as in the measurement of the initial particle size, and the measurement value was recorded as a particle size with time. The particle size stability of each inkjet ink was ranked in accordance with the following two-stage assessment standards: A: the ratio ($\phi2/\phi1$) of the particle size with time ($\phi2$) to the initial particle size ($\phi1$)≦1.5, and B: $\phi2/\phi1$>1.5.

<Viscosity and Storage Stability>

The inkjet inks obtained in Example II-26 and Comparative Example II-6 were each allowed to stand at 25° C. for 1 hour. Subsequently, the viscosity of the inkjet ink was measured using an E-type viscometer ("RE80 Model", trade name; manufactured by Tokyo Industry Co., Ltd.; value at 50 rpm), and the measurement value was recorded as an initial viscosity. Subsequent to the measurement of the initial viscosity, the same sample was held at 50° C. for 10 days and its viscosity with time was measured in a similar manner as in the measurement of the initial viscosity. Its storage stability was ranked in accordance with the following 2-stage assessment standards: A: the ratio ($\eta2/\eta1$) of the viscosity with time ($\eta2$) to the initial viscosity ($\eta1$)≦2.0, and B: $\eta2/\eta1$>2.0.

Color Hue and Transparency

Each inkjet ink prepared as described above was spread over a sheet of hiding power test paper (product of Nippon Testpanel Co., Ltd.) by a bar coater (gauge No. 6), and its 60 deg. gloss was measured by a gloss meter ("HAZE GLOSS-METER", trade name; manufactured by BYK-Chemie GmbH). The inkjet ink was also spread over a commercial OHP film for inkjet recording by a bar coater (gauge No. 6), and its transparency was visually assessed. The assessment results were ranked in accordance with the following 3-stage standards: A: high transparency, B: semi-transparency, and C: no transparency.

The above test results are shown in Tables II-4 and II-5.

TABLE II-4

|  | Example II-26 | Comp. Ex. II-6 |
|---|---|---|
| Initial particle size | 87 | 105 |
| Particle size with time | 93 | 170 |
| Particle size stability | A | B |
| Initial viscosity | 12.3 | 13.4 |
| Viscosity with time | 13.4 | 35.5 |
| Storage stability | A | B |

(unit of particle size: nm, unit of viscosity: mPa · s)

TABLE II-5

|  | Example II-26 | Comp. Ex. II-6 |
|---|---|---|
| Gloss | 68 | 57 |
| Transparency | A | B |

(unit of gloss: %)

The inkjet ink according to the present invention, which made use of the acid-group-containing compound, had a small initial particle size and showed excellent particle size stability with time that remained substantially unchanged with time. Concerning fluidity, it also showed a low initial viscosity and excellent viscosity stability with time. Compared with the comparative product, it was also excellent in transparency and had a high gloss.

What is claimed is:

1. A pigment composition comprising an organic pigment and at least one compound selected from compounds represented by the following formulas (II-2) and (II-3), respectively:

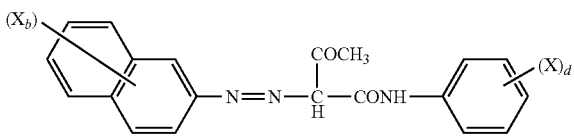

Formula (II-2)

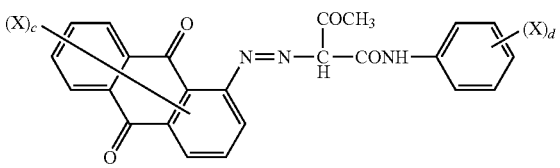

Formula (II-3)

wherein d stands for an integer of from 0 to 5, b and c each independently stand for an integer of from 0 to 7, X represents a substituent when b, c and d are 1, Xs each independently represent a substituent when b, c and d are an integer of 2 or greater, with a proviso that said compounds represented by the formulas (II-2) and (II-3), respectively, each have at least one substituent represented by COOM or $SO_3M$ in which M represents a hydrogen atom, metal atom, ammonium group, organic amine group or quaternary ammonium group.

2. A pigment composition according to claim 1, wherein in the formula (II-2), b stands for an integer of 1; in the formula (II-3), c stands for an integer of 0 or 2; and in the formulas (II-2) and (II-3), d stands for an integer of 0, 1 or 2, X represents $CH_3$, $OCH_3$, or $SO_2NH_2$; with a proviso that said compounds represented by the formulas (II-2) and (II-3), respectively, each have at least one substituent represented by $SO_3M$ in which M represents a hydrogen atom, metal atom, ammonium group, organic amine group or quaternary ammonium group.

3. A pigment composition according to claim 1, wherein said organic pigment is at least one pigment selected from C.I. Pigment Yellow 138, C.I. Pigment Yellow 150, C.I. Pigment Green 7, C.I. Pigment Green 36, C.I. Pigment Red 122, and C.I. Pigment Violet 19.

4. A pigment composition according to claim 1, wherein said organic pigment has a primary particle size of not greater than 100 nm.

5. A pigment composition according to claim 1, wherein said at least one compound selected from said compounds represented by the formulas (II-2) and (II-3), respectively, is contained in a mixing proportion of from 0.1 to 30 parts by weight per 100 parts by weight of said organic pigment.

6. A colored composition comprising a pigment composition according to claim 1 and a film-forming material.

7. An inkjet ink comprising a colored composition according to claim 6 and a liquid medium.

8. A coating formulation for the formation of color filter pigments, comprising a colored composition according to claim 6 and a liquid medium.

9. A color filter comprising pixels formed with a coating formulation according to claim 8.

* * * * *